REMOVABLE STACK INTERCONNECTION SYSTEM

Filed Sept. 7, 1967 2 Sheets-Sheet 1

INVENTOR.
IAN LOFTUS FERGUSSON

BY

Kenyon & Kenyon

ATTORNEYS

Jan. 27, 1970 I. L. FERGUSSON 3,492,538

REMOVABLE STACK INTERCONNECTION SYSTEM

Filed Sept. 7, 1967 2 Sheets-Sheet 2

INVENTOR.
IAN LOFTUS FERGUSSON

BY Kenyon & Kenyon

ATTORNEYS 3,492,538
REMOVABLE STACK INTERCONNECTION SYSTEM

Ian L. Fergusson, New Hope, Pa., assignor to Thomas & Betts Corporation, Elizabeth, N.J., a corporation of New Jersey Filed Sept. 7, 1967, Ser. No. 666,053
Int. Cl. H02b *1/04, 9/00*
U.S. Cl. 317—101 7 Claims

ABSTRACT OF THE DISCLOSURE

The present invention relates to a removable multi-conductor cable assembly which is particularly suitable for interconnecting the conductors of a stack of printed circuit boards. Basically, the assembly is designed to interconnect the conductors of a stack of printed circuit boards by aligning the individual conductors of a multi-conductor flat cable with the appropriate conductors on each printed circuit board. More particularly, the assembly is comprised of a length of multiconductor cable having a plurality of clips permanently affixed thereto which serve to attach the assembly to each printed circuit board and positively connect the conductors of the flat cable assembly with the conductors on each of a stack of printed circuit boards. The clip includes an inner channel member having a plurality of spring fingers extending inwardly from each of the facing channel sides which are prealigned to engage each conductor of the multi-conductor flat cable and apply a force thereto to effect positive contact thereof with the conductors on the printed circuit board. Also included as part of the clip design is an outer locating channel member which is cemented to the outer surface of each of the inner channel members to fit snugly therearound. Each of the outer channel members has fastening means extending from each side which serve to removably secure the assembly to each printed circuit board.

BACKGROUND OF THE INVENTION

Field of the invention

The invention is directed primarily to connecting the circuitry of a stack of printed circuit boards. It is especially applicable in miniaturized computer systems where the pitch between each printed circuit board is small. One specific area where the invention has been found to have particular utility for interconnection is in a core memory stack of a computer.

DESCRIPTION OF THE PRIOR ART

The prior art includes various devices for connecting the conductors that extend from one printed circuit board to the conductors of another printed circuit board but fails to include a single removable cable assembly designed to afford quick positive and reliable connection in a miniaturized application.

At present, the most common technique for interconnecting the circuitry of a stack of printed circuit boards is by passing insulated or bare wires through the stack and soldering the wires to the boards at appropriate points. This technique requires that after the wires are soldered in place, they must be cut off at appropriate points to effect the proper isolation of each circuit or system. It is apparent that this method of interconnecting the circuitry of a stack of printed circuit boards is time-consuming and arduous during the initial assembly. In addition, this method of assembly becomes further complicated when a miniaturized system is being interconnected.

As a consequence, it has become necessary to find connecting devices which are reliable and which can be used when the center line distance between adjacent boards is .250 inch or less.

The problem becomes more critical every day since computer design has placed an accent on miniaturization. As ferrite cores and other active components of the memory systems are improved to afford miniaturization thereof, the hardware and passive elements of the computer must also be miniaturized to function in this compact environment. The advantages gained and space saving realized by miniaturization of the active components is lost if the hardware and passive components can not be reduced.

Moreover, maintenance of a stack of printed circuit boards normally requires the replacement of individual boards as defects are found therein. Therefore, a removable interconnection system is considerably more efficient than the present soldered wire interconnection system. The feature of removability takes on added importance in systems wherein a single board may be replaced with another having a different message or where replacement of printed circuit boards is desirable as more efficient and superior printed circuit boards are developed.

Accordingly, it is an object of the present invention to provide a device which can connect the circuitry of a stack of printed circuit boards.

It is another object of the invention to provide a removable multi-conductor flat cable assembly having means to facilitate positive connection between the individual conductors of the multi-conductor flat cable assembly and the conductors on a stack of printed circuit boards.

Yet another object of the invention is to provide a removable multi-conductor flat cable assembly having application in connecting the circuitry of printed circuit boards of a core memory stack which has provisions for aligning the individual conductors of the multi-conductor flat cable with the appropirate conductors on the printed circuit boards.

A further object of the present invention is to provide a removable multi-conductor flat cable assembly which is capable of assuring positive contact between the conductors of the multi-conductor flat cable and the printed circuit board conductors in environments where space requirements are critical.

A still further object of the present invention is to provide a removable prealigned flat conductor cable assembly to interconnect the circuitry of a plurality of memory boards arranged in a stack.

An additional object of the present invention is to provide a reliable and inexpensive removable multi-conducfor flat cable system which can be used in stack memory arrangements where clearance between the individaul memory boards is minimal.

Another object of the present invention is to provide a removable multi-conductor flat cable assembly for interconnecting the circuitry of a stack of printed circuit boards which is compatible with a miniaturized environment.

SUMMARY OF THE INVENTION

These and other objects of the invention are achieved by a simple design for a removable multi-conductor flat cable assembly, one embodiment of which is comprised of a length of multi-conductor flat cable having permanently affixed thereto a plurality of metal clip-like members for attachment to each of the printed circuit boards in a stack. The clip-like members consist essentially of an inner channel member having a plurality of spring fingers which protrude internally from each of the channel sides to engage the individual conductors of the multi-conductor flat cable. The clip-like members further include an outer channel member having the inner surface of the base member conforming to and affixed to the outer surface of the base of the inner channel member and provided with inwardly facing locating tabs on each end that fit in locating slots on the respective memory boards to align the conductors of the flat cable with the circuitry on each memory board. In addition, this design requires that the conductors of the multi-conductor flat cable be broken at appropriate locations to interfere with the flow of current and thereby confine the individual electrical paths to the proper circuit.

DESCRIPTION OF THE DRAWINGS

A better appreciation of the invention can be had from the following detailed specification taken in conjunction with the attached drawings in which.

DESCRIPTION OF THE PREFERRED EMBODIMENT

Figure 2:
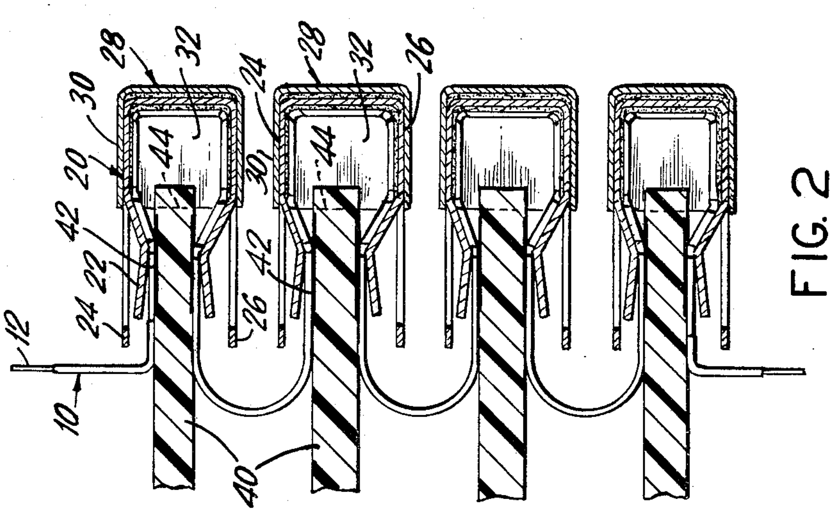
FIG. 2 is a sectional view through line 2—2 of FIG. 1.
Figure 1:
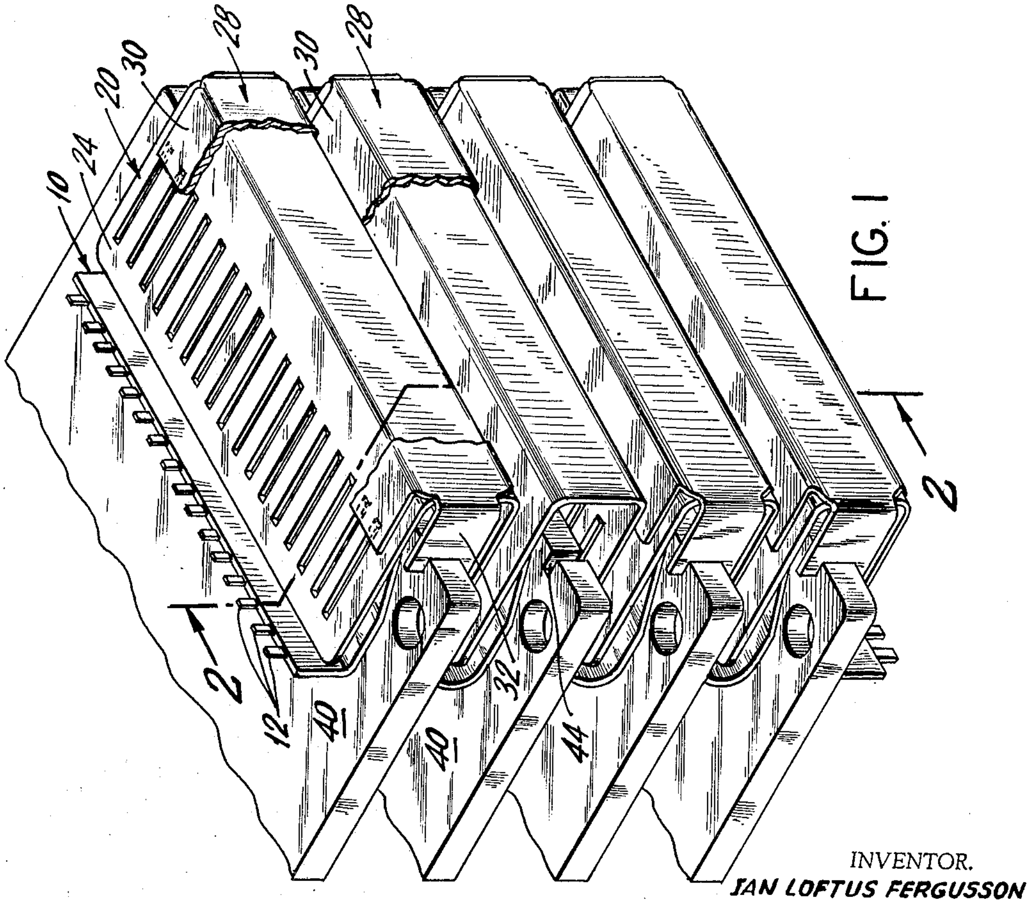
FIG. 1 is a perspective view of the composite cable assembly with the locating and alignment means shown attaching the assembly to the plurality of the memory boards arranged in a stack.

In order to better illustrate the invention, one example of the removable multi-conductor flat cable assembly will be described. This particular embodiment of the invention consists of a section of multi-conductor flat cable 10, a plurality of inner channel member 20 having alignment fingers 22 and a plurality of outer channel members 30 all of which are seen in FIG. 1 and FIG. 2. Basically, the multi-conductor cable 10 consists of a plurality of essentially parallel conductors 12 completely imbedded in insulation material. The number of conductors 12 chosen for each application is determined by the number of conductors 42 in the circuitry of the stack of printed circuit boards 40 which must be interconnected. In addition, the design also contemplates that each of the conductors 12 be prealigned to mate with the appropriate conductors 42 on each printed circuit board 40 when the assembly is properly oriented and attached to the stack of printed circuit boards 40.

Figure 3:
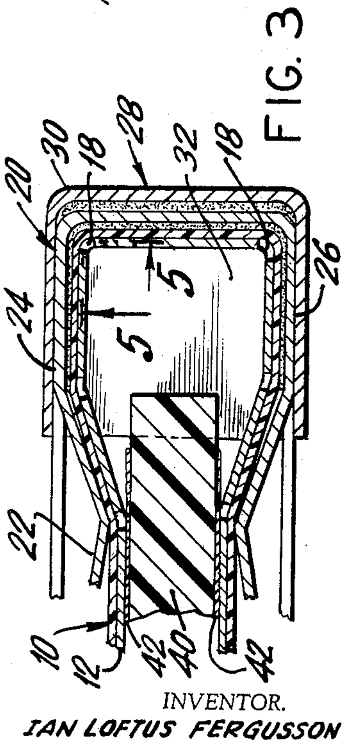
FIG. 3 is a detail of a section of the assembly showing the relationship of parts with respect to each other and a printed circuit board to which it attaches.

Positive contact of the conductors 12 with the respective conductors 42 located on the printed circuit boards 40 is effected by a plurality of fingers 22 extending inwardly from the walls 24 and 26 of inner channel members 20 as seen in FIG. 2 and FIG. 3. Each of the spring fingers 22 are designed for alignment with the individual conductors 12 and sized to exert a force thereon to insure positive contact between conductors 12 in the multi-conductor cable 10 and the respective conductors 42 on the printed circuit board 40. It has been found that the most effective contact results from a design wherein the fingers 22 are formed by being punched from stainless steel channel members 20. Accordingly, this would be characterized as the optimum design. It should also be noted that, while stainless steel has proved to be the most satisfactory material from which to fashion channel members 20 and 30, it is obvious that many other materials can be used therefor.

Further versatility in the design resides in the actual shape of the fingers 22 which are generally shown as being angled. However, it has been found that the fingers 22 will perform satisfactorily if configured differently.

Figure 6:
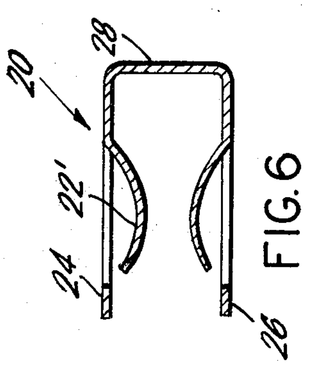
FIG. 6 is a cross sectional view of the clamp with resilient fingers shown in the arcurate form.

As seen in FIG. 6, the fingers 22' are provided with an arcuate shape.

When the fingers 22 are aligned with the conductors 12, the inner channel member 20 is affixed to the multi-conductor cable 10 by cementing the inner surface 28 of the inner channel member 20 to a length of the multi-conductor cable 10 as best seen in FIG. 3.

As seen in FIG. 1 and FIG. 2, the inner channel members 20 must be affixed to the multi-conductor cable 10 at each point where the multi-conductor cable 10 will attach to a memory board 40. Again, it has been found that it is most expedient to use cement or a similar adhesive to affix the inner channel member 20 to the multi-conductor cable 10, however, any method of attachment can be used.

Figure 4:
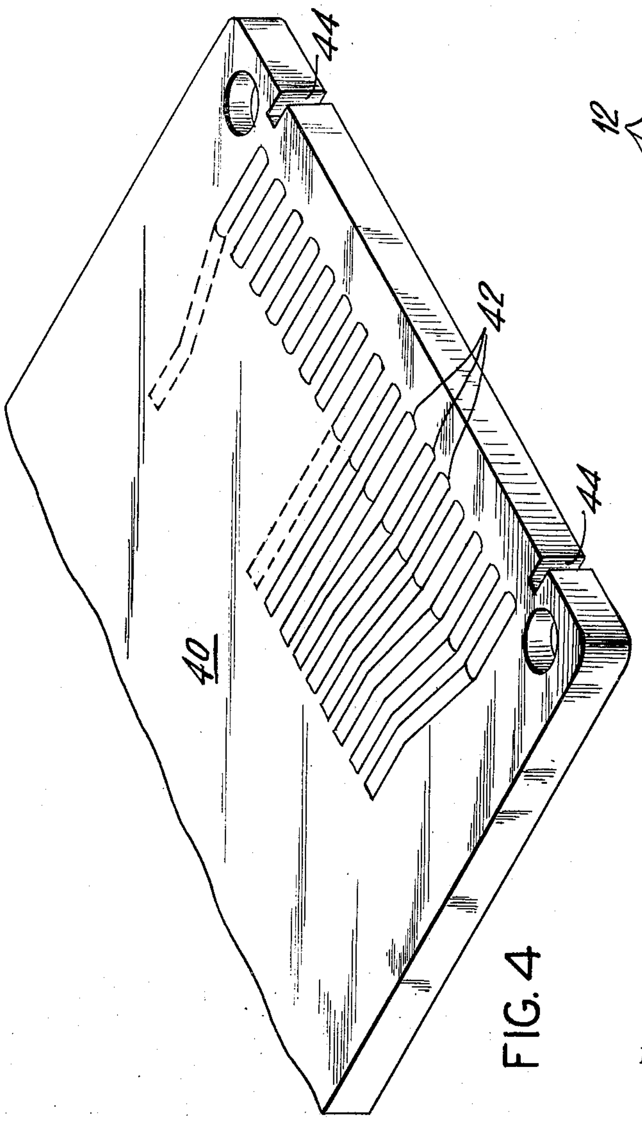
FIG. 4 is a perspective view on one of the individual printed circuit boards of the stack to which the multi-conductor cable assembly is designed to attach.

The cable assembly also includes an outer channel member 30, the inner dimensions of which are sized to conform to the outer surface of the inner channel member 20. The function of the outer channel member 30 is to attach the composite cable assembly to each printed circuit board 40 in the stack. This is accomplished by locating the tabs 32 which extends from the opposite ends of the outer channel member 30 to fit within the locating slots 44 in each printed circuit board 40, as best seen in FIG. 1 and FIG. 4. Again, the locating tabs 32 which are formed integrally with the outer channel member 30 represent what has been found to be the optimum design. Accordingly, any attachment provisions can be employed to secure the cable assembly to each printed circuit board 40. For example, the tabs 32 may be oriented to lie in the same plane as the spring fingers 22 and fit in slots on the printed circuit boards 40 configured to accommodate them. Moreover, it is obvious from the design that, rather than utilizing an outer channel member 30 to carry the attachment means, the inner channel member 20 can be designed to carry them. However, it is critical that any means used to attach the interconnection assembly to the printed circuit boards 40 be designed to facilitate removability.

The outer channel member 30 is designed to be affixed to the inner channel member 20 when it is certain that the insertion of locating tabs 32 in locating slots 44 will fix spring fingers 22 in proper alignment with the conductors 12 of the multi-conductor cable 10. The outer channel member 30 is fixed to the inner channel member 20 by securing the inner surface of base 32 to the outer surface of the base member 28 of inner channel member 20. As best seen in FIG. 3, attachment of the outer channel member 30 to the inner channel member 20 is effected by an appropriate adhesive material such as cement. Again, while cement is chosen as the means for fixing members 20 and 30 together, it is obvious that any securing means can be used.

Figure 5:
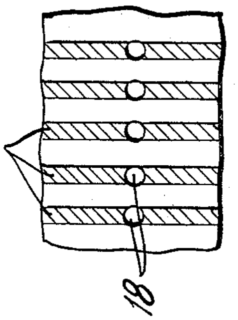
FIG. 5 is a sectional view through line 5—5 of FIG. 3.

To assemble the interconnection system for attachment to a stack of printed circuit boards 40, insulation is stripped from the multi-conductor cable 10 along the side that faces the conductors 42 which the cable assembly conductors 12 must engage. It is recommended that a minimum amount of insulation be stripped from each cable 10 since the cable assembly attains greater structural rigidity when the integrity of the cable 10 is least disturbed. However, any length of insulation may be removed as long as the channel member 20 remains insulated from the conductors 12. As seen in FIG. 3, insulation has been removed from the multi-conductor cable 10 along a portion thereof that extends from the upper surface of one of the printed circuit boards 40 to a point which is in contact with the lower surface of the printed circuit board 40. This is a simple expedient employed in this case because there are conductors 42 on both sides of printed circuit boards 40 which require interconnection with the circuitry on other printed circuit boards 40 in the stack. Hence, in this application it is convenient to strip the cable once to prepare the conductors 12 for contact with the conductors 42 on both sides of each printed circuit board 40. It must be noted that in this application the individual conductors 12 have been broken at points 18 as seen in FIG. 3 and FIG. 5 to create interference points that isolate the circuitry on the upper side of each printed circuit board 40 from the circuitry on the lower side of each printed circuit board 40. This design is for a particular application and is merely illustrative of the basic interconnection assembly design. Obviously, if the application was directed to connecting the circuitry on the upper side of the printed circuit board 40 to the circuitry on the lower side of the printed circuit board 40, the conductors 12 would not be broken.

After the cable has been properly stripped of insulation, the channel member 20 is affixed to the cable 10 at each location where contact to a printed circuit board 40 must be made such that spring fingers 22 align with each conductor 12. Subsequently, the outer channel member 30 is positioned with the inner surface of its base 34 in engagement with the outer surface of the base 28 of inner channel member 20 and permanently affixed thereto when it is certain that connection of the locating tabs 32 in the slots 44 will maintain the fingers 22 in alignment with the conductors 12.

Thus, there has been described a removable interconnection assembly which has particuluar application in interconnecting the circuitry of a stack of printed circuit boards in miniaturized systems. The interconnection assembly is characterized by its removability, the simplicity of effecting interconnection and its reliability, therefore the assembly can be used wherever interconnection of the circuitry of a plurality of printed circuit boards is necessary.

I claim:

1. A removable interconnection assembly for interconnecting the circuitry on a stack of printed circuit boards comprising:

a plurality of outer channel members having locating tab members which attach the interconnection assembly to each memory board;

a plurality of inner channel members, the outer surface of the base of which is permanently affixed to the inner surface of the base of each outer channel member, the inner channel members having resilient biasing means extending inwardly from both sides of each of the inner channel members; and a length of multi-conductor flat cable which is fixedly attached to the base member of each inner channel member at various points along its length having the individual conductors thereof aligned with and in intimate contact with the appropriate conductors on the printed circuit board and aligned with the resilient biasing means of the inner channel member which thereby bias them into intimate contact with the appropriate conductors on the printed circuit board.

2. An interconnection assembly as described in claim 1 wherein the resilient biasing means extending inwardly from each side of the inner channel member is a parallel arrangement of spring fingers individually aligned with each conductor of the multi-conductor flat cable.

3. An interconnection assembly as described in claim 2 wherein the spring fingers extending inwardly from the inner channel member are integrally formed with the inner channel members.

4. An interconnection assembly as described in claim 3 wherein each of the outer channel members are permanently affixed to each of the inner channel members by cement; and the multi-conductor flat cable is permanently affixed to the inner channel members by cement.

5. A stack of printed circuit boards;

a length of flat conductor cable, the individual conductors of which are aligned with appropriate conductors on each of the printed circuit boards;

a plurality of elongated inner channel members extending substantially the width of said cable permanently affixed to the cable at various points along its length having a plurality of individual spring fingers extending inwardly therefrom aligned with the individual conductors of the multi-conductor cable and sized to exert a force thereon which will maintain the conductors in intimate contact with the conductors on the printed circuit board; and means to attach each channel member to an individual printed circuit board.

6. An interconnection system as described in claim 5 wherein the means to attach each channel member to the individual printed circuit boards is a plurality of outer channel members, each of which are affixed permanently to each of the inner channel members and which have attachment means extending therefrom which attach the assembly to each printed circuit board.

7. An interconnection system as described in claim 6 wherein the individual conductors of the multi-conductor flat cable are broken at points to interrupt the flow of current and to isolate various individual circuits.

References Cited

UNITED STATES PATENTS 3,158,421 11/1964 Hasenauer.
3,376,479 4/1968 Wines et al.

ROBERT K. SCHAEFER, Primary Examiner

J. R. SCOTT, Assistant Examiner

U.S. Cl. X.R.

339—17, 176